(12) United States Patent
Chao et al.

(10) Patent No.: US 7,183,492 B2
(45) Date of Patent: Feb. 27, 2007

(54) MULTI-LAYER PRINTED CIRCUIT WITH LOW NOISE

(75) Inventors: Shih-Chieh Chao, Taipei (TW);
Chih-Wen Huang, Taipei (TW);
Chun-Lin Liao, Taipei (TW)

(73) Assignee: Tatung Co., Ltd. (TW)

( * ) Notice: Subject to any disclaimer, the term of this patent is extended or adjusted under 35 U.S.C. 154(b) by 0 days.

(21) Appl. No.: 11/055,617

(22) Filed: Feb. 11, 2005

(65) Prior Publication Data

US 2006/0090930 A1 May 4, 2006

(30) Foreign Application Priority Data

Nov. 3, 2004 (TW) ................ 93133515 A

(51) Int. Cl.
*H05K 1/03* (2006.01)

(52) U.S. Cl. ........................ 174/255; 361/795
(58) Field of Classification Search ............. 174/255, 174/260, 261, 262; 361/792, 793, 794, 795, 361/816, 818; 333/243, 246, 1.12, 247
See application file for complete search history.

(56) References Cited

U.S. PATENT DOCUMENTS

| | | | | | |
|---|---|---|---|---|---|
| 4,942,400 | A | * | 7/1990 | Tarzaiski et al. | 341/155 |
| 5,068,596 | A | * | 11/1991 | Banura | 323/351 |
| 5,561,584 | A | * | 10/1996 | Tang | 361/220 |
| 5,587,920 | A | * | 12/1996 | Muyshondt et al. | 716/15 |
| 5,736,796 | A | * | 4/1998 | Price et al. | 307/151 |
| 5,926,377 | A | * | 7/1999 | Nakao et al. | 361/763 |
| 6,219,255 | B1 | * | 4/2001 | Teshome | 361/794 |
| 6,349,038 | B1 | * | 2/2002 | Hailey | 361/794 |
| 6,473,312 | B1 | * | 10/2002 | Hiratsuka et al. | 361/794 |
| 7,068,518 | B2 | * | 6/2006 | Ueno et al. | 361/760 |

* cited by examiner

*Primary Examiner*—Ishwar I. B. Patel
(74) *Attorney, Agent, or Firm*—Bacon & Thomas PLLC

(57) ABSTRACT

A multi-layer printed circuit board having a low noise characteristic, the multi-layer printed circuit board includes: at least one circuit layer; at least one isolation line for dividing the at least one circuit layer into at least two areas, the at least one isolation line forms an open pattern and the at least one isolation line extendedly forms a long neck line into the at least one area, and an internal opening of the long neck line located at a geometric center of the at least one area to improve the isolation, especially for the noises near the resonant frequencies of the isolation areas.

5 Claims, 3 Drawing Sheets

MULTI-LAYER PRINTED CIRCUIT WITH LOW NOISE

BACKGROUND OF THE INVENTION

1. Field of the Invention

The present invention relates to a multi-layer printed circuit board and more particularly, to a multi-layer printed circuit having low noise characteristics.

2. Description of the Related Art

Please refer to FIG. 1. FIG. 1 is shown a prior art printed circuit board. A printed circuit board 10 is composed of three different circuit layers; one is for power, one is for ground, and the other is for components. A component layer (top side or bottom side) is used for the layout of signal line (as a signal layer). Electronic elements are placed on the top layer or the bottom layer of the printed circuit board 10, and signal pins, power pins, and ground pins are respectively connected to the other electronic components on the component layer, the power layer, and the ground layer. Additionally, the electronic components can be divided into two groups, analog electronic components and digital electronic components. The analog electronic components may be an audio chip, an amplifier, a power supplier, etc.; and the digital electronic components may be a digital signal processor (DSP), a microprocessor, a video driver, etc. To avoid noise generated by the digital electronic components from affecting the analog electronic components, an isolation area 11 is usually separated from the power and/or ground layer of the printed circuit board 10. A portion within the isolation area 11 is called an analog electronic component area A1, and the other portion outside of the isolation area 11 is called the digital electronic component area A2. No connection exists between the analog electronic component area A1 and the digital electronic component area A2. Hence, noise generated by the digital electronic components cannot pass through the power layer to affect the analog electronic components, and the interference from the printed circuit board 10 is reduced significantly. Similarly, the ground layer of the printed circuit board 10 can have the same design.

However, when the connections between digital and the analog electronic components are required, the signal lines have to cross over the isolation area 11; the reference plane of the signal lines is not continuous and it will affect the signal quality. Furthermore, the electromagnetic interferences between signals will become stronger, and the electromagnetic radiations are likely to exceed legal standards. In a prior art, a metal neck line is used to connect the two isolation areas to provide continuous voltage levels, but the noise isolation between the areas is very poor near the resonant frequencies of the two isolation area structures, which is not a desirable characteristic.

Therefore, it is desirable to provide a multi-layer printed circuit with low noise to mitigate and/or obviate the aforementioned problems.

SUMMARY OF THE INVENTION

A main objective of the present invention is to provide a multi-layer printed circuit with low noise.

In order to achieve the above-mentioned objective, a multi-layer printed circuit with low noise includes at least one component layer; and an isolation line. The isolation line is used for dividing the at least one component layer into at least two areas. The at least one isolation line forms an open pattern and a long neck line into the at least one area. An internal opening of the long neck line is located at a geometric center of the at least one area to reduce the noise near the resonant frequencies. The isolation line divides the printed circuit board into an analog electronic components area and a digital electronic components area. Since the analog electronic components area has an opening, the isolation line can be extendedly placed at the opening to form the long neck line to electrically connect the analog electronic components area and the digital electronic components area. Since the voltage level of the power plane is continuous and the signal line connecting the analog electronic components area and the digital electronic components area are above the neck, the signal's return current can be easily back through the neck, the electromagnetic radiation of the printed circuit board can be reduced.

The opened pattern can be an opened circle, an opened triangle, an opened rectangle, an opened pentagon, an opened hexagon or any other opened pattern.

Furthermore, capacitors can be placed open near the analog electronic components area or the digital electronic components area to improve the noise isolation in some particular frequencies.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
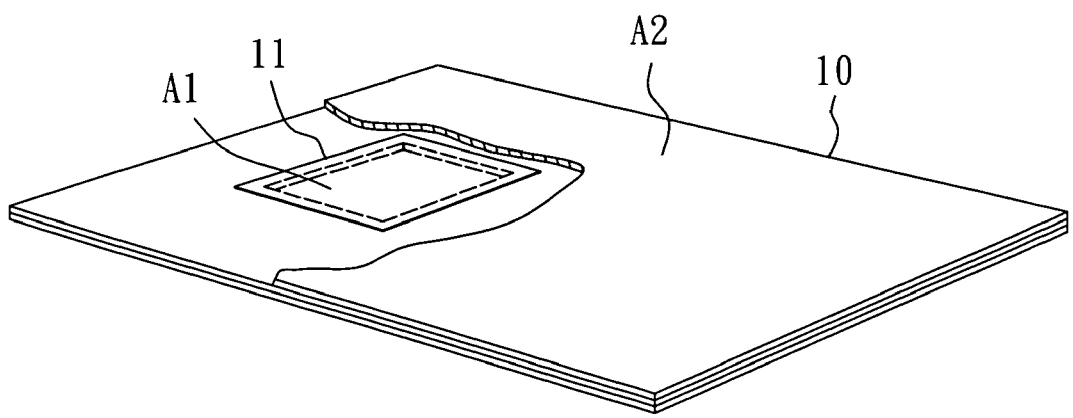
FIG. 1 is a schematic drawing of a prior art printed circuit board.
Figure 2:
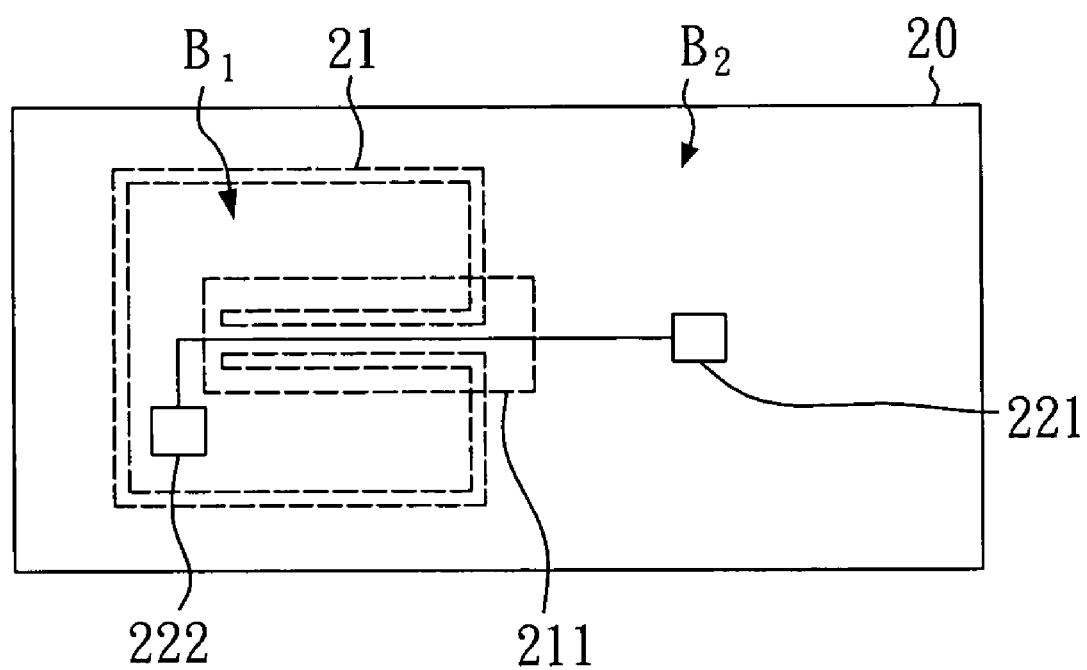
FIG. 2 is a schematic drawing of a printed circuit board of a preferred embodiment according to the present invention.

FIG. 2 is shown a schematic drawing of a printed circuit board of a preferred embodiment according to the present invention. A printed circuit 20 has a component layer, with a power layer and a grounded layer (not shown) that are respectively placed above and below it. Many digital electronic components 221 and many analog electronic components 222 are placed on the printed circuit board 20. In this embodiment, an isolation line 21 is used to surround an analog electronic component area B1 to form an open rectangle and to extend into the analog electronic components area B1 to form a long neck line 211. The rest of the area of the printed circuit board 20 is a digital electronic components area B2. Signal lines for connecting the digital electronic components 221 and the analog electronic components 222 pass over the long neck line 211. When frequencies of the signal generated by the electronic components in these two areas are similar to the resonant frequencies of their structure, the noise isolation between the two areas is poor. In the transmission line theory, to achieve good isolation, the difference of the impedances between the long neck line 211 and the opening in areas B1 or B2 should keep larger. Usually the long neck line 211 acts as a transmission line with high impedance. Therefore, the width of the long neck line 211 can be reduced to increase its impedance, or the opening of the long neck line 211 can be placed at the geometric center of the area because the lowest impedances of these two areas are located at their geometric centers for the lower order modes of the structures. Therefore, not only the noises near the resonant frequencies can be properly filtered by the proposed method, but the signal integrity between the two areas can be maintained.

Figure 3:
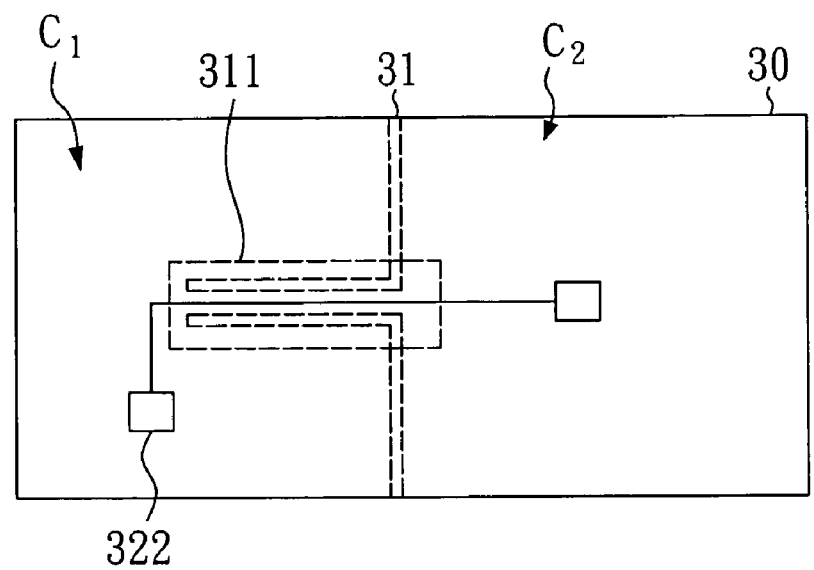
FIG. 3 is a schematic drawing of a printed circuit board of another preferred embodiment according to the present invention.

FIG. 3 is shown the printed circuit board of another preferred embodiment according to the present invention. In FIG. 3, an isolation line 31 still divides a printed circuit board 30 into an analog electronic components area C1 and a digital electronic components area C2, but the isolation line 31 does not surround all of the analog electronic components 322. In this embodiment, the isolation line 31 extends towards the analog electronic components area C1 to form a long neck line 311, with an opening that is located at the geometric center of the analog electronic components area C1, which provides the effects similar to the previous embodiment.

Figure 4:
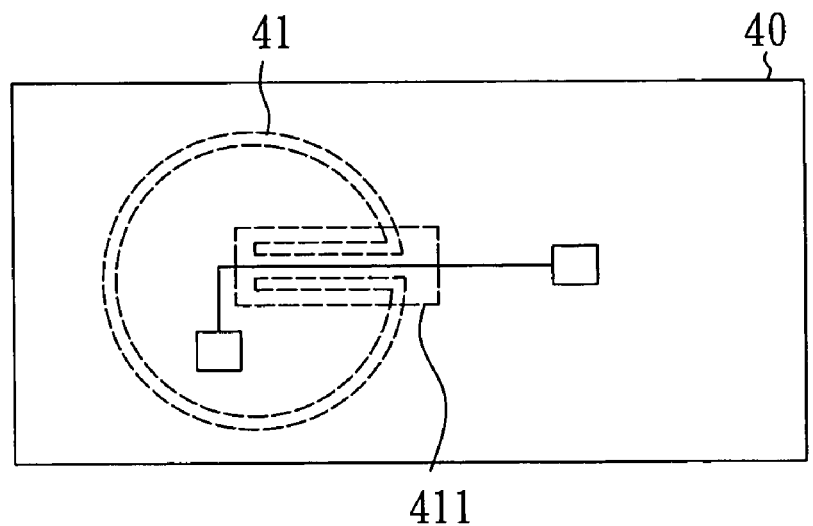
FIG. 4 is a schematic drawing of a printed circuit board of another preferred embodiment according to the present invention.

FIG. 4 is shown the printed circuit board of another preferred embodiment according to the present invention. In this embodiment, an isolation line 41 forms a circular pattern, with all the other elements being the same, and which has the effects similar to the previous embodiment.

Although the present invention has been explained in relation to its preferred embodiment, it is to be understood that many other possible modifications and variations can be made without departing from the spirit and scope of the invention as hereinafter claimed.

What is claimed is:

1. A multi-layer printed circuit board having a low noise characteristic, the multi-layer printed circuit board comprising:
   at least one circuit layer;
   at least one isolation line for dividing the at least one circuit layer into at least two areas, the at least one isolation line forming an open pattern and having opposing end portions extending into one of the at least two areas forming a longneck line into the one of the at least two areas, an internal end of the long neck line located at a geometric center of the one of the at least two areas;
   wherein the open pattern forms a closed shape with an opening connected to the long neck line.

2. The multi-layer printed circuit board as claimed in claim 1, wherein the open pattern is an open rectangle.

3. The multi-layer printed circuit board as claimed in claim 1 further comprising at least one capacitor placed at one side of the opening of the open pattern in the any one of the areas.

4. The multi-layer printed circuit board as claimed in claim 1 comprising at least one analog area and at least one digital area.

5. The multi-layer printed circuit board as claimed in claim 1, wherein the at least one circuit layer comprises three circuit layers, which include a power layer, a ground layer, and a component layer.

* * * * *